(12) United States Patent
Mobley

(10) Patent No.: US 9,111,917 B2
(45) Date of Patent: Aug. 18, 2015

(54) LOW COST AND HIGH PERFORMANCE BONDING OF WAFER TO INTERPOSER AND METHOD OF FORMING VIAS AND CIRCUITS

(71) Applicant: TRITON MICROTECHNOLOGIES, Oro Valley, AZ (US)

(72) Inventor: Tim Mobley, Marana, AZ (US)

(73) Assignee: TRITON MICROTECHNOLOGIES, Oro Valley, AZ (US)

( * ) Notice: Subject to any disclaimer, the term of this patent is extended or adjusted under 35 U.S.C. 154(b) by 99 days.

(21) Appl. No.: 13/666,089

(22) Filed: Nov. 1, 2012

(65) Prior Publication Data

US 2013/0105211 A1 May 2, 2013

Related U.S. Application Data

(60) Provisional application No. 61/554,417, filed on Nov. 1, 2011.

(51) Int. Cl.
*H01L 21/48* (2006.01)
*H01L 23/15* (2006.01)

(52) U.S. Cl.
CPC .............. *H01L 21/486* (2013.01); *H01L 23/15* (2013.01); *H01L 2924/0002* (2013.01)

(58) Field of Classification Search
CPC .... H01L 21/486; H01L 23/15; H01L 21/4857
See application file for complete search history.

(56) References Cited

U.S. PATENT DOCUMENTS

| 7,183,650 | B2* | 2/2007 | Shiono et al. ................. 257/758 |
| 2011/0108931 | A1* | 5/2011 | Mohri et al. ................. 257/414 |
| 2011/0220925 | A1* | 9/2011 | Greenwood .................... 257/91 |
| 2013/0341653 | A1* | 12/2013 | Yuan et al. ...................... 257/88 |

* cited by examiner

Primary Examiner — Jose R Diaz

(57) ABSTRACT

A low cost and high performance method for bonding a wafer to an interposer is provided. The technology provides designs and metallization techniques for through via glass applications that is thermal coefficient expansion matched to the glass or synthetic fused quartz substrates. An off-the-shelf glass, such as borosilicate based or Fused Synthetic Quartz, is used with a thick film Cu or Ag and/or a Sodium Ion Enriched (SIE) coating or glass, which may be applied or fired onto the substrate or wafer. Polymer based coatings can be applied in a sequential build-up process for purposes of redistribution of signals from a silicon integrated circuit to the opposite side of the substrate or wafer. Additionally, metallizations can be applied on top of the polymers and patterned to create a multilayer circuit.

10 Claims, 3 Drawing Sheets

LOW COST AND HIGH PERFORMANCE BONDING OF WAFER TO INTERPOSER AND METHOD OF FORMING VIAS AND CIRCUITS

BACKGROUND

As electronic systems become more powerful and complex, integrated circuits incorporate very small features. Current silicon (Si) Integrated Circuits (IC) have features that are so small that they are placed on a substrate to be connected to external components. The substrate is normally known as an interposer. Interposers can be simple substrates with wirebond landings for wire bonding directly to the SiIC or specialized interposers with electrically conducting vias to allow flip chip bonding. What is needed is an improved method for building reliable interposers.

SUMMARY

Embodiments of the present invention provide a low cost and high performance method for bonding a wafer to an interposer. The invention provides designs and metallization techniques for TGV (Through Glass Via) applications that is TCE (Thermal coefficient expansion) matched to the glass or synthetic fused quartz substrates. The present invention is used with an off-the-shelf glass, which may include borosilicate based or Fused Synthetic Quartz. A thick film Cu or Ag and/or a Sodium Ion Enriched (SIE) coating or glass may be applied or fired onto the substrate or wafer. Polymer based coatings can be applied in a sequential build-up process for purposes of redistribution of signals from the Si IC (Silicon Integrated Circuit) to the opposite side of the substrate or wafer. Additionally, metallizations can be applied on top of the polymers and patterned to create a multilayer circuit.

In an embodiment, a method for forming an interposer may include applying a sodium ion enriched glass on a substrate or wafer. A via may be created in the sodium-ion enriched glass. A thick film may then be deposited into the via of the sodium ion enriched glass.

In an embodiment, a semiconductor device may include a sodium ion enriched glass and a thick film. The sodium ion enriched glass may be deposited on a substrate. The thick film may be deposited onto the surface of the sodium ion enriched glass.

DETAILED DESCRIPTION

As electronic systems become more powerful and complex, integrated circuits incorporate very small features. Current silicon (Si) Integrated Circuits (IC) have features that are so small that they are placed on a substrate to be connected to external components. The substrate is normally known as an interposer. Interposers can be simple substrates with wirebond landings for wire bonding directly to the Si IC or specialized interposers with electrically conducting vias to allow flip chip bonding.

Some interposers used in Si IC devices are attached to the silicon via a process known as Anodic Bonding. Anodic bonding is a process during which an electrical bias is applied across a Si IC and the glass wafer followed by applying a temperature of 200-500° C. to the Si IC and glass wafer. The silicon device is bonded to the glass wafer within 10-60 minutes of heating. The higher the temperature, the faster the bond is formed between the Si IC and glass wafer. In order to anodically bond to the glass, Sodium ions need to be present. The higher the concentration of Sodium ions, the faster and stronger the bond that is formed.

Currently, several off-the-shelf glass materials are available to use to anodically bond to a silicon wafer. The materials that contain sodium typically have a CTE between 3.2 and 3.4 ppm/° C. with a Youngs modulus in the range of 60-65 GPa. Some non-Sodium (or non-Alkali) glasses have a higher Young's (75-80), which if the sodium can be strategically applied in locations of interest, such as vias, then an overall wafer TCE match can be better made. The lower Young's modulus causes a deterioration of the Si IC function due to the stresses that are between the Si and the glass. Float glasses that have sodium ions that are cost/performance competitive with standard alkali based borosilicate glass do not exist. Borosilicate glass may have an exact match for CTE to the SI IC, but does not have Sodium ions in the formulation and is not currently manufactured with vias.

Currently, most Thru-Glass Via (TGV) utilize plated vias with spin coated metalizations which are very labor intensive and costly materials and not reliable in end applications. Currently, there are no prior art low cost and high performance design solutions for TGV applications that are TCE matched to the glass or synthetic quartz substrates.

Embodiments of the present invention begin with an off-the-shelf glass, such as borosilicate glass or Fused Synthetic Quartz, or other glass or ceramic based substrate or wafer. Thick Film Cu or Ag and/or a Sodium Ion Enriched (SIE) coating or glass may be deposited, applied or fired onto the substrate or wafer. Polymer based coatings can be applied in a sequential build-up process for purposes of redistribution of signals from the Si integrated circuit (IC) to the opposite side of the substrate or wafer.

Figure 1:
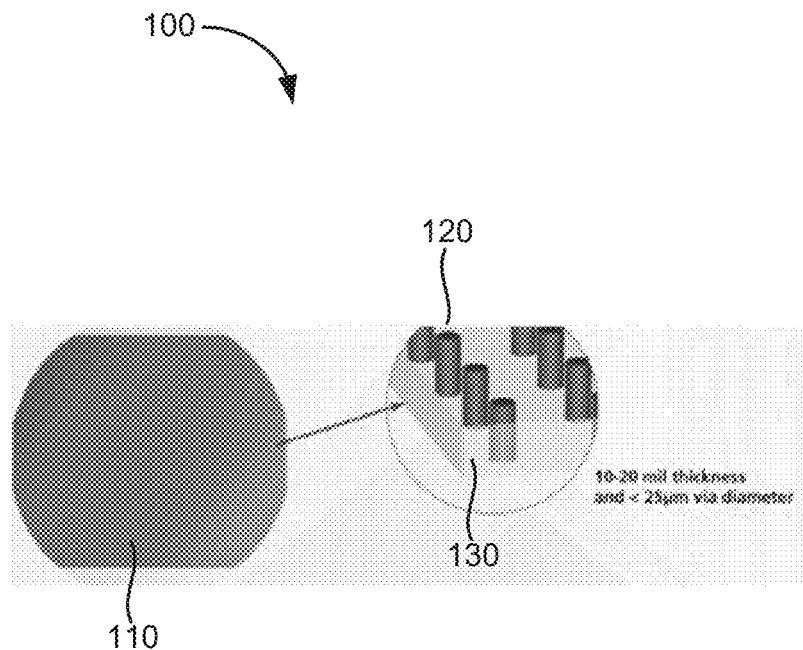
FIG. 1 illustrates a side view of a wafer having metallization and sodium ion enriched coating layers.

FIG. 1 illustrates a top view of a wafer 100 having metallization and sodium ion enriched layers. Wafer device 110 may include a series of sodium ion enriched (SIE) glass layers deposited over a wafer, which may be from borosilicate glass. One or more metallization layers may be deposited over the SIE glass layer. The sodium ion enriched glass may include one or more vias which may be filled with the metallization material, resulting in one or more thru-glass vias. The SIE is also deposited on the side walls of the via in order to strengthen the bond of the metalization to the glass substrate or wafer and acts as a TCE match between the two.

Figure 2:
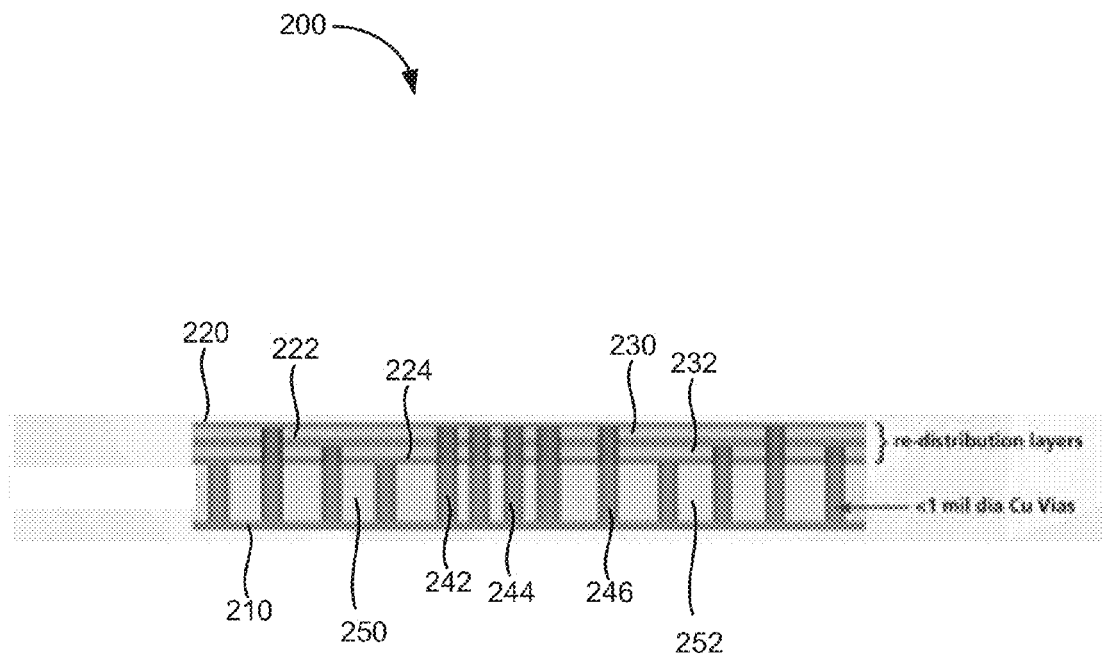
FIG. 2 illustrates a top view of a wafer having metallization and sodium ion enriched coating layers

FIG. 2 illustrates a side view of a wafer device 200 having metallization and sodium ion enriched coating layers. As shown in the device 200, one or more thru-glass vias 242, 244 and 246 may be formed through glass material 250 and 252. Circuit layers 220, 222, and 224 may be formed over alternating layers of SIE glass 230 and 232. The SIE glass may be applied to the outer surface of wafer device 200 to seal the thru-glass vias. The SIE may also be applied to the side walls of the via prior to metallization.

Figure 3:
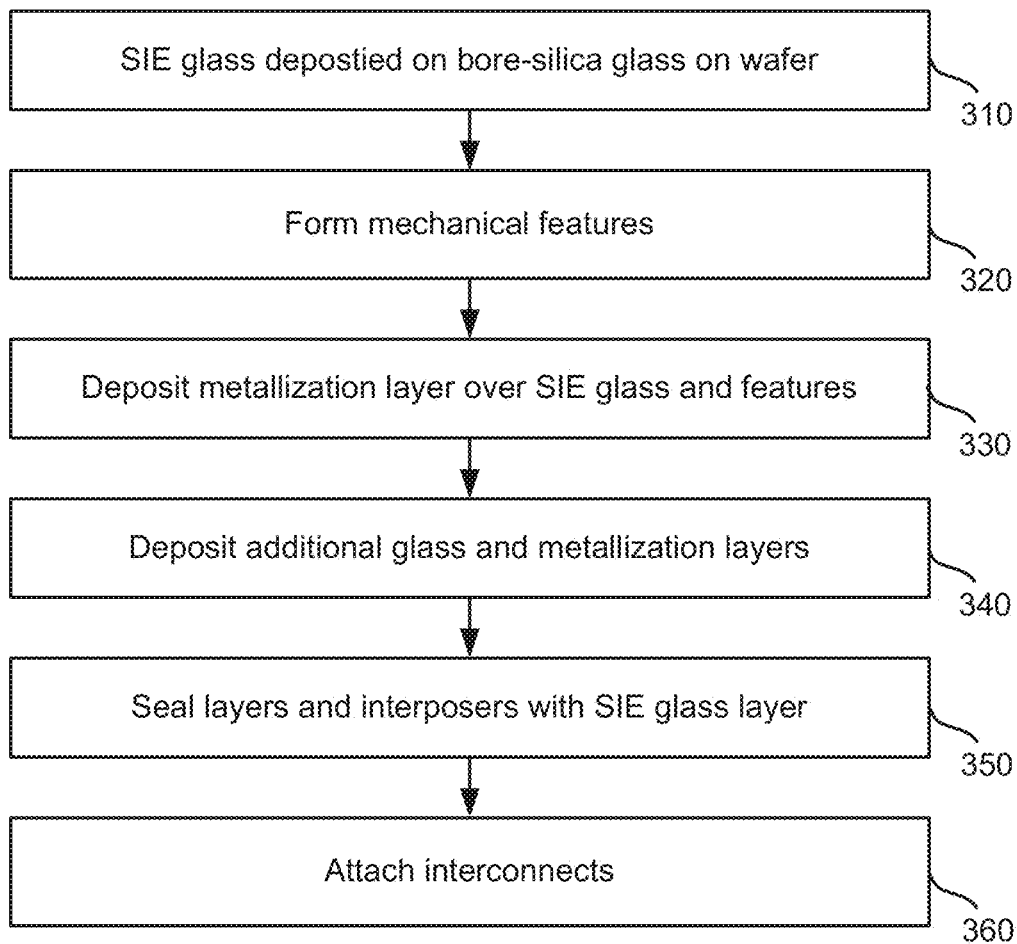
FIG. 3 illustrates a method for bonding a wafer to an interposer.

FIG. 3 illustrates a method for bonding a wafer to an interposer. A sodium ion enriched (SIE) glass may be deposited, fired or otherwise applied to borosilicate glass or fused synthetic quartz substrate or wafer at step 310. The glass can be applied by spin coating screen printing methods. Coatable glass can be spinned on with a 500-900 nanometer D50, which will provide the ability to make small feature sizes and allow hermetic vias. The SEI coating enables an anodic bond to the Si IC.

The thickness and the Young's Modulus of the SIE glass may be adjusted. The adjustment may be made, for example for a thickness range of 1 micron to 10 microns, by controlling and varying the speed, viscosity and volume of the glass being spinned. The glass may be a spin coatable or screen printable glass that is photo imageable for the creation of a route distribution layer and micro vias. The photo imaging of the spin coatable glass may be performed using methods known in the art, such as standard mask techniques.

One or more mechanical features may be formed at step 320. The mechanical features may include vias, cavities, and other features. The glass may be applied in the form of a paste with the ability to photodefine small features such as vias, cavities and other features. The glass may also be laser machined to create vias, cavities, and other mechanical features.

A metallization layer may be deposited over the SIE glass and mechanical features such as vias at step 330. A thick film, such as a copper (Cu) or silver (Ag) thick film, may be fired onto surfaces of the SIE glass and into vias and other features. The thick film may be screen printed or deposited onto the planar surfaces before and after the SIE process. The thickness of the film can be adjusted, and the film can be chemically, mechanically, or laser etched from the surface. The resulting material can be plateable, solderable, and wire-bondable. Thin film, such as Cr/Ni/Au or Cr/Cu/Au may also be utilized and patterned to create circuit patterns.

Additional SIE glass and metallization layers may be deposited, for example in alternating orders, at step 340. The additional SIE glass layers and metallization (thin or thick film) layers may serve as re-distribution layers within the wafer device being formed. The metal layers and interposers may be sealed with an SIE glass later at step 350. Hence, the SIE coating can be utilized between redistribution layers and the SI IC as well as over the uppermost metallization layer. In some embodiments, the thickness of the SIE coating will not exceed 1-12 microns.

Interconnects may be attached to the wafer device interposer at step 360. The interposer of the present invention may attach to interconnects such as solder balls, wire bonds, signal, power or ground leads, and can have spin coatable, screen printable, or deposited dielectrics and metal layers for the creation of a route distribution and micro vias.

The substrate or wafer, sodium ion enriched glass, and metalization may form a wafer level package. The wafer level package may be attached to a multilayer ceramic or PWB to form a System in a Package (SiP). The SiP can form signal processing, digital processing, RF and analog processing, power sources, memory storage (etc) and components. The SiP can be attached to a motherboard or larger PWB.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A method for forming a semiconductor device, comprising:
   applying a sodium ion enriched glass on a surface of a substrate to form a sodium ion enriched glass layer on the substrate;
   subsequently creating a via in the sodium-ion enriched glass layer of the substrate;
   subsequently applying a thick film into the via of the sodium ion enriched glass layer to form the semiconductor device, wherein the via terminates at the surface of the substrate such that the film is touching the surface of the substrate; and
   subsequently applying an additional sodium ion enriched glass to an outer surface of the semiconductor device to seal the via.

2. The method of claim 1, wherein the substrate is borosilicate glass or fused synthetic quartz.

3. The method of claim 1, wherein the thick film is a copper thick film sintered at 650 C or 850 C.

4. The method of claim 1, wherein the thick film is a silver thick film sintered at 850 C and having less than 5% shrinkage.

5. The method of claim 1, wherein a surface of the sodium ion enriched glass layer is processed using a technique selected from a group consisting of:
   a. chemically laser etching;
   b. mechanically laser etching;
   c. plating;
   d. soldering; and
   e. wire-bonding.

6. The method of claim 1, further comprising attaching interconnects to the thick film.

7. The method of claim 1, further comprising spin coating, screen printing, or depositing dielectrics or metal layers to create a route distribution or micro-via.

8. The method of claim 1, further comprising attaching the semiconductor device to a multi-layer ceramic or a printed wiring board (PWB) to form a system in a chip.

9. The method of claim 8, wherein the system in a chip implements a digital processing, radio frequency and analog processing, power source or memory storage component.

10. The method of claim 8, wherein the system in a chip is communicatively coupled to a motherboard or a second PWB.

* * * * *